(12) United States Patent
Sai

(10) Patent No.: US 7,132,351 B2
(45) Date of Patent: Nov. 7, 2006

(54) METHOD OF FABRICATING A COMPOUND SEMICONDUCTOR LAYER

(75) Inventor: Hironobu Sai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/897,915

(22) Filed: Jul. 23, 2004

(65) Prior Publication Data

US 2005/0020036 A1 Jan. 27, 2005

(30) Foreign Application Priority Data

Jul. 25, 2003 (JP) ............................. 2003-280286

(51) Int. Cl.
*H01L 21/36* (2006.01)
*H01L 21/20* (2006.01)

(52) U.S. Cl. ......... 438/483; 257/E21.85; 257/E21.108; 257/E21.117; 257/E21.126

(58) Field of Classification Search .................... None
See application file for complete search history.

(56) References Cited

U.S. PATENT DOCUMENTS

| | | | | |
|---|---|---|---|---|
| 5,400,354 A | * | 3/1995 | Ludowise et al. | 372/46.013 |
| 5,588,994 A | * | 12/1996 | Bozler et al. | 117/89 |
| 5,686,350 A | * | 11/1997 | Lee et al. | 438/479 |
| 5,724,374 A | * | 3/1998 | Jewell | 372/45.01 |
| 5,881,085 A | * | 3/1999 | Jewell | 372/46.013 |
| 6,472,695 B1 | * | 10/2002 | Hall et al. | 257/190 |
| 6,714,572 B1 | * | 3/2004 | Coldren et al. | 372/46.013 |
| 6,916,717 B1 | * | 7/2005 | Li et al. | 438/287 |
| 2001/0006528 A1 | * | 7/2001 | Sato et al. | 372/46 |
| 2002/0084525 A1 | * | 7/2002 | Chua et al. | 257/743 |
| 2004/0081215 A1 | * | 4/2004 | Johnson et al. | 372/45 |
| 2004/0086013 A1 | * | 5/2004 | Kim | 372/45 |

FOREIGN PATENT DOCUMENTS

| | | |
|---|---|---|
| JP | 07-60791 | 5/1990 |
| JP | 05-32486 | 2/1993 |
| JP | 10-51075 | 2/1998 |
| JP | 2000-223502 | 8/2000 |

* cited by examiner

*Primary Examiner*—Asok Kumar Sarkar
(74) *Attorney, Agent, or Firm*—Hamre, Schumann, Mueller & Larson, P.C.

(57) ABSTRACT

A method of fabricating a compound semiconductor layer has steps of forming a first layer made of an oxidizable material on a substrate, forming a second layer made of a compound semiconductor on the first layer, oxidizing the first layer made of the oxidizable material to an oxide layer and forming a third layer made of compound semiconductor that constitutes a semiconductor element on the second layer.

13 Claims, 1 Drawing Sheet

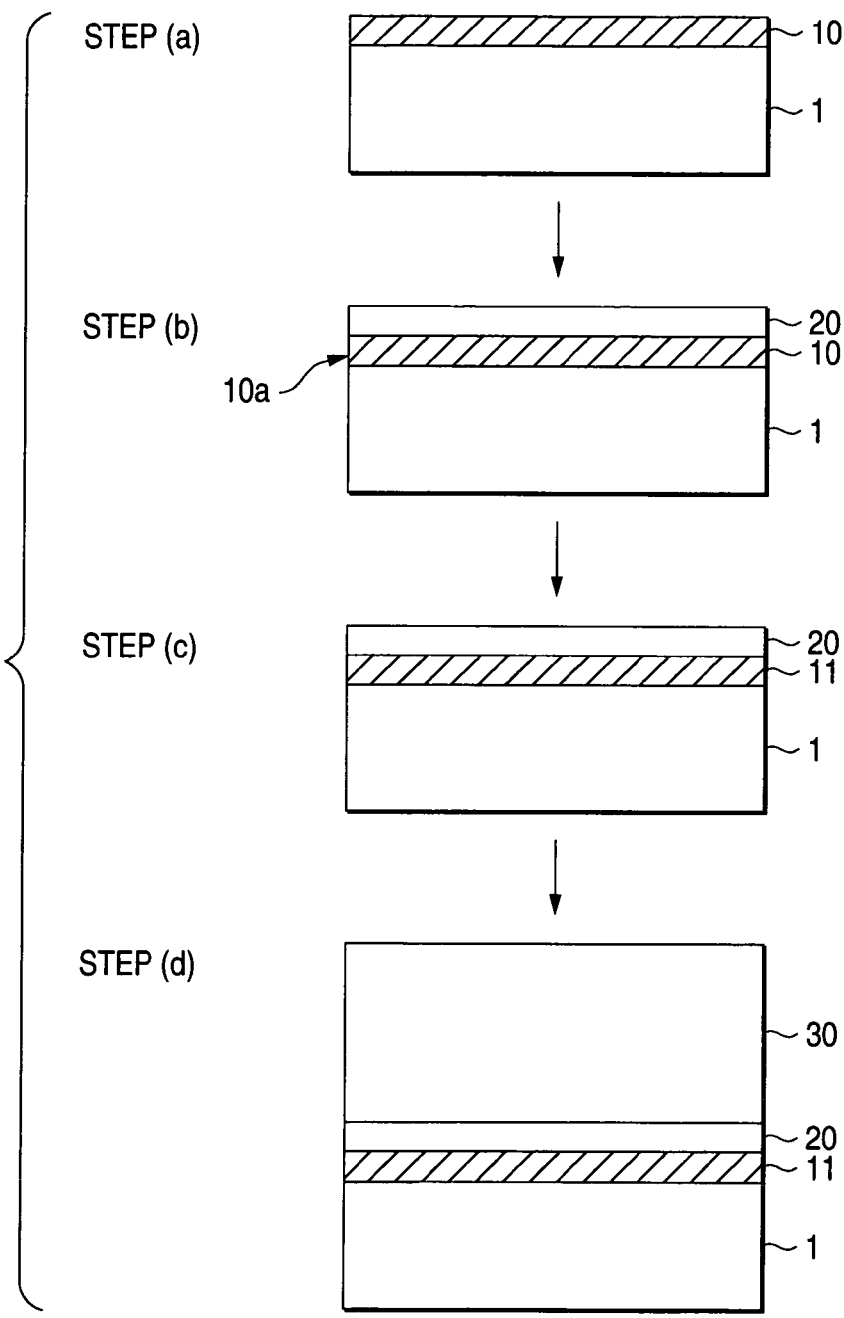

METHOD OF FABRICATING A COMPOUND SEMICONDUCTOR LAYER

The present invention claims foreign priority to Japanese patent application no. JP2003-280286, filed on Jul. 25, 2003, the contents of which is incorporated herein by reference.

BACKGROUND OF THE INVENTION

1. Field of the Invention

The present invention relates to a method of fabricating a compound semiconductor layer on a substrate by forming a thin layer of a compound semiconductor which material is different from that of the substrate.

2. Description of the Related Art

Compound semiconductors are extensively used in a variety of semiconductor elements and optical devices represented by semiconductor lasers, solar cells and high speed transistors such as HEMT. However, because these devices use a substrate made of a compound semiconductor, they are very expensive. Thus, trials are being made to use, as the substrate, Si, Ge, sapphire and the like which can be economically fabricated in the form of a large diameter crystal, and to make a compound semiconductor layer grow epitaxially on such a substrate.

However, formation of a compound semiconductor layer excelling in crystalline nature is difficult since distortions are likely to develop therein due to the difference in crystal structure, particularly in lattice constant, between the substrate and the compound semiconductor. To cope with such lattice unconformity, various countermeasures have been adopted including distortion relaxation via an annealing treatment after the formation of the compound semiconductor layer (See, for example, Japanese Patent Unexamined Publication JP-A-5-32486 claim 1, p. 3 to 4), and interposition of an intermediate (buffer) layer between the substrate and the compound semiconductor layer whereby the intermediate layer has a lattice constant close to those of the two materials (See, for example, Japanese Patent Examined Publication JP-B-7-60791 claim 1, p. 3 to 4).

The foregoing method such as annealing treatment or buffer layer interposition is effective in the case where the difference in lattice constant between the substrate and the compound semiconductor is relatively small. Specifically, when the difference in lattice constant does not exceed roughly 3%, a compound semiconductor layer having a thickness of about several μm and with substantially a satisfactory crystal quality can be obtained. However, when the difference in lattice constant exceeds 3%, the numbers of dislocation and defect in the compound semiconductor layer become so noticeable that the layer cannot be used as an electronic device. Hence, the actual situation of electronic device manufacture is to select the combination of a substrate with a compound semiconductor wherein the difference in lattice constant does not exceed 3%.

SUMMARY OF THE INVENTION

The performance of a semiconductor element or an optical device each comprising a compound semiconductor largely varies depending on the compositions of the substrate and the compound semiconductor layer. But, as have been stated above, the difference in lattice constant has the range of allowance, which fact acts as a serious limitation on the design of a semiconductor element as well as an electronic device or on the improvement of their performances.

The invention has been made in view of such situations, and the purpose thereof is to provide a method of fabricating a compound semiconductor layer, the method being capable of expanding the range of allowance for the difference in lattice constant between the substrate and the compound semiconductor layer compared with the conventional methods, and mitigating the compositional limitation in the design and performance improvement of a semiconductor element as well as an optical device.

Inventors of the present invention have completed the invention based on the finding that, as a result of a dedicated study to achieve the above-mentioned purpose, by forming a thin layer of an oxidizable material on a substrate, then forming a compound semiconductor layer on the oxidizable material layer, oxidizing the oxidizable material whereby the compound semiconductor layer acts as a new substrate, and further forming a compound semiconductor portion that operates as the active part of a semiconductor element in succession, a compound semiconductor layer having sufficiently scarce dislocations as well as defects can be obtained since the crystalline association between the original substrate and the compound semiconductor operating as a semiconductor element is completely intercepted.

According to a first aspect of the present invention, there is provided a method of fabricating a compound semiconductor layer, comprising steps of forming a first layer made of an oxidizable material on a substrate, forming a second layer made of a compound semiconductor on the first layer, oxidizing the first layer made of the oxidizable material so that the first layer is converted to an oxide layer and forming a third layer made of compound semiconductor on the second layer, wherein the third layer is used for fabricating a semiconductor element.

According to a second aspect of the present invention according to the first aspect of the present invention, wherein a thickness of the second layer is from 5 nm to 100 nm.

According to a third aspect of the present invention according to the first aspect of the present invention, wherein the oxidizable material of the first layer is a III–V compound semiconductor containing at least 50% of Al.

According to a fourth aspect of the present invention according to the third aspect of the present invention, wherein the oxidizable material of the first layer contains at least 70% of Al.

According to a fifth aspect of the present invention according to the third aspect of the present invention, wherein the oxidizable material of the first layer is AlAs.

According to a sixth aspect of the present invention according to the third aspect of the present invention, wherein the oxidizable material of the first layer is $Ga_xAl_{1-x}As$, wherein x is more than 0.5.

According to a seventh aspect of the present invention according to the first aspect of the present invention, wherein the oxidizable material of the first layer is oxidized by contacting of an oxidizable gas.

According to an eighth aspect of the present invention according to the seventh aspect of the present invention, wherein the first layer has a groove through which the oxidizable gas can be communicated.

According to a ninth aspect of the present invention according to the seventh aspect of the present invention, wherein the oxidizable gas is a water vapor.

According to a tenth aspect of the present invention according to the first aspect of the present invention, wherein the third layer is a mixed crystal containing at least one selected from Al, Ga, In, As, P, Sb, N.

According to an eleventh aspect of the present invention according to the first aspect of the present invention, wherein further comprising a step of removing the oxide layer after forming the third layer.

According to a twelfth aspect of the present invention according to the first aspect of the present invention, wherein the thickness of the first layer is more than 10 nm.

According to a thirteenth aspect of the present invention according to the first aspect of the present invention, wherein the oxide layer is porous.

According to a fourteenth aspect of the present invention according to the first aspect of the present invention, wherein the third layer is used for fabricating a semiconductor element.

BRIEF DESCRIPTION OF THE DRAWINGS

FIG. 1 is a process chart for the explanation of the method of fabricating a compound semiconductor layer of the invention.

DETAILED DESCRIPTION OF THE PREFERRED EMBODIMENT

In the following, the invention is described in detail with reference to the drawing.

FIG. 1 is a process chart describing the method of fabricating a compound semiconductor layer according to the invention. First of all, as shown in step (a) of FIG. 1, a thin layer 10 comprising an oxidizable material is formed on a substrate 1. Here, as the kind of the substrate 1, which is not specifically limited, in addition to a Group IV semiconductor such as Si and Ge, a ceramic such as sapphire and SiC, or a compound semiconductor such as GaAs and GaP may be used. From the viewpoint of production cost, it is preferred to use a Group IV semiconductor or a ceramic for the substrate.

The oxidizable material need not always satisfy lattice conformity between the substrate and the compound semiconductor to be formed thereon in a layer form. However, as will be explained soon, the more readily oxidizable is the material, the better, since the oxidation treatment is conducted after the formation of a thin layer of the compound semiconductor. Specifically, an III-V compound semiconductor containing Al in 50% or more, preferably 70% or more is preferred. For example, AlAs and $Ga_xAl_{1-x}As$ ($x \geq 0.5$) are preferably used. The thickness of the thin layer 10 comprising an oxidizable material is not specifically limited, but a thickness of 10 nm or more is suited. With a thickness below 10 nm, a prolonged period is required for the oxidation treatment to be described later, thus causing disadvantages in production efficiency and cost. Further, with the reduction of Al content, oxidation becomes difficult.

Next, as shown in step (b) of FIG. 1, a thin layer 20 comprising a compound semiconductor is formed on the thin layer 10 comprising an oxidizable material. This thin layer 20 of a compound semiconductor is required to cause such a lattice relaxation within the layer as to achieve lattice conformity between the thin layer 30 comprising a compound semiconductor and the thin layer 10 comprising a compound semiconductor since a compound semiconductor portion 30 constituting a semiconductor element is formed thereon in step (d) of FIG. 1 to be described later. For that purpose, the thickness of the thin layer 20 of the compound semiconductor is made far thinner than that of the compound semiconductor portion 30.

Thereafter, as shown in step (c) of FIG. 1, oxidation of the thin layer 10 made of an oxidizable material converts the thin layer into an oxide layer 11. Since the thin layer 10 made of an oxidizable material is sandwiched between the substrate 1 and the compound semiconductor layer 20 in the present configuration, an oxidizing agent must be introduced for oxidation from the edge plane 10a of the thin layer 10 comprising the oxidizable material. As one of such oxidizing means, contact with an oxidizing gas is mentioned, where by water vapor oxidation is suited. Then, in the aforementioned step (b) of FIG. 1, it is preferred to select an oxidizable material suited for water vapor oxidation. One preferable example is AlAs. AlAs readily undergoes oxidation when brought into contact with water vapor and is converted into porous $Al_2O_3$. In addition, in order to conduct the water vapor oxidation efficiently with certainty, a large number of grooves acting as paths for water vapor are preferably provided in this AlAs layer over its entire area.

By the formation of this oxide layer 11, the association in crystal structure of the substrate 1 with the compound semiconductor layer 20 is intercepted. And compound semiconductor layer 20 becomes an apparently independent thin layer.

Thereafter, as shown in step (d) of FIG. 1, compound semiconductor portion 30 acting as a semiconductor element is formed on the very thin compound semiconductor layer 20 as a new substrate. Through such steps, the compound semiconductor portion 30 acting as a semiconductor element can be formed without concerning about lattice conformity with the original substrate 1, enabling various combinations of the substrate 1 with the compound semiconductor portion 30 acting as a semiconductor element which have been unavailable in the conventional techniques.

Meanwhile, when a substance on a substrate is grown epitaxially, the epitaxial layer (the compound semiconductor layer 20 in the present case) absorbs the distortion due to crystal structure such as lattice unconformity. Such distortion accumulates along with the growth of the epitaxial layer, finally remaining in the forms of dislocation and defect. Namely, the distortion due to crystal structure develops, not in the thick substrate, but in the thin epitaxial layer on the substrate.

Accordingly, by making the thickness of the compound semiconductor layer 20 acting as a new substrate far thinner than that of the first layer in the compound semiconductor portion 30 acting as a semiconductor element, the distortion developing during the formation of the compound semiconductor portion 30 acting as a semiconductor element is absorbed by the compound semiconductor layer 20. Specifically, in the aforementioned step (b) of FIG. 1, the thickness of the compound semiconductor layer 20 is made 1 μm or less, preferably 100 nm or less. When the compound semiconductor layer 20 is thicker than these ranges, the material composition of the compound semiconductor portion 30 is limited. On the other hand, when the compound semiconductor layer 20 is thinner than these ranges, the influence of the oxidation of the layer 20 made of an oxidizable material appears in the compound semiconductor portion 30. By taking into consideration these factors, the thickness of the compound semiconductor layer 20 is preferably from 5 to 100 nm.

Via the series of the aforementioned steps, the compound semiconductor portion 30 acting as a semiconductor element can be formed without accompanying any generation of dislocation and defect. Moreover, since the compound semiconductor portion 30 acting as a semiconductor element can be formed independently from substrate 1, the degree of freedom increases in the element design, thus realizing conventionally unavailable combinations of the substrate 1 with the compound semiconductor portion 30 acting as a semiconductor element.

Actually, on a Si, GaAs or sapphire substrate, a mixed crystal containing Al, Ga, In, As, P, Sb or N can be formed containing neither dislocation nor defect. More specifically, as is shown in the following example, in an InGaAs/GaAs semiconductor laser, according to the conventional processes, In could be contained at maximum in about 30 mol % in an InGaAs mixed crystal with a thickness not exceeding several ten nm. In contrast, according to the invention, even when In is contained up to about 30 mol %, a dislocation-free and defect-free InGaAs layer can be formed on a GaAs layer with no limitation on the layer thickness.

Note that after forming the compound semiconductor layer, the oxide layer 11 maybe removed there from by soaking in etching solution. Accordingly, an upper layer including the compound semiconductor layer 20 and the compound semiconductor portion 30 is separated from a lower layer of substrate 1, thereby it becomes possible to use only the obtained upper layer itself as the semiconductor element.

EXAMPLE

The invention is further described below with reference to an example.

On a semi-insulating GaAs (lattice constant=5.653) substrate, a 200 nm thick AlAs layer was formed by MOCVD (Metal Organic Chemical Vapor Deposition) process (See step (a) of FIG. 1.). Further, over the entire surface of this AlAs layer, scribe lines in a checkerboard pattern were provided by etching. Thereafter, on the AlAs layer, GaAs was fabricated in a layer form with 50 nm thicknesses by MOCVD process (See step (b) of FIG. 1.). Then, in 400 to 450° C. water vapor, the AlAs layer was converted to a porous $Al_2O_3$ layer (See step (c) of FIG. 1.). And, On the GaAs layer, an $In_{0.3}Ga_{0.7}As$ (lattice constant=5.76) layer, which constitutes the first layer of the laser layer, was formed in 3 μm thickness, and then the second layer and so forth were formed thereon (See step (d) of FIG. 1.) in turn.

The surface of the $In_{0.3}Ga_{0.7}As$ layer thus formed was observed by etching with respect to the existence of dislocation and defect. The result was that dislocations of only $1 \times 10^5$ cm$^{-2}$ or less were observed.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

According to the invention, in the formation of a compound semiconductor layer, the limitation on the crystalline structure relative to that of the substrate is mitigated compared with the conventional methods. Thus, the degree of freedom in the design of semiconductor elements as well as optical devices is enhanced, and trials for performance improvement can be advantageously carried out, too.

What is claimed is:

1. A method of fabricating a compound semiconductor layer, comprising steps of:
    forming a first layer made of an oxidizable material on a substrate;
    forming a second layer made of a compound semiconductor on the first layer;
    oxidizing the first layer made of the oxidizable material subsequent to forming the second layer so that the first layer is converted to an oxide layer; and
    forming a third layer made of compound semiconductor on the second layer, wherein the compound semiconductor of the second layer differs from the compound semiconductor of the third layer.

2. A method of fabricating a compound semiconductor layer as set forth in claim 1, wherein a thickness of the third layer is from 5 nm to 100 nm.

3. A method fabricating a compound semiconductor layer as set forth in claim 1, wherein the oxidizable material of the first layer is an Ill–V compound semiconductor containing at least 50% of Al.

4. A method of fabricating a compound semiconductor layer as set forth in claim 3, wherein the oxidizable material of the first layer contains at least 70% of Al.

5. A metbod of fabricating a compound semiconductor layer as set forth in claim 3, wherein thc oxidizable material of the first layer is AlAs.

6. A method of fabricating a compound semiconductor layer as set forth in claim 3, wherein the oxidizable material of the first layer is $Ga_xAl_{1-x}As$, wherein x is more than 0.5.

7. A method of fabricating a compound semiconductor layer as set forth in claim 1, wherein the oxidizable material of the first layer is oxidized by contacting with an oxidizable gas.

8. A method of fabricating a compound semiconductor layer as set forth in claim 7, wherein the oxidizable gas is a water vapor.

9. A method of fabricating a compound semiconductor layer as set forth in claim 1, wherein the third layer is a mixed crystal containing at least one selected from Al, Ga, In, As, P, Sb, N.

10. A method of fabricating a compound semiconductor layer as set forth in claim 1, further comprising a step of:
    removing the oxide layer after forming the third layer.

11. A method of fabricating a compound semiconductor layer as set forth in claim 1, wherein the thickness of the first layer is more tban 10 nm.

12. A method of fabricating a compound semiconductor layer as set forth in claim 1, wherein the oxide layer is porous.

13. A method of fabricating a compound semiconductor layer as set forth in claim 1, wherein the third layer is used for fabricating a semiconductor element.

* * * * *